United States Patent [19]

Egawa

[11] Patent Number: 4,811,192
[45] Date of Patent: Mar. 7, 1989

[54] INVERTER APPARATUS

[75] Inventor: Akira Egawa, Yamanashi, Japan

[73] Assignee: Fanuc Ltd., Yamanashi, Japan

[21] Appl. No.: 207,092

[22] PCT Filed: Oct. 15, 1987

[86] PCT No.: PCT/JP87/00781
§ 371 Date: Jun. 13, 1988
§ 102(e) Date: Jun. 13, 1988

[87] PCT Pub. No.: WO88/02949
PCT Pub. Date: Apr. 21, 1988

[30] Foreign Application Priority Data

Oct. 15, 1986 [JP] Japan .................. 61-243201
Oct. 15, 1986 [JP] Japan .................. 61-243207

[51] Int. Cl.4 ........................................ H02M 7/537
[52] U.S. Cl. ................................ 363/132; 363/98;
323/289; 307/270
[58] Field of Search ................. 363/17, 97, 98, 131,
363/132, 133, 134; 323/289; 307/270

[56] References Cited

U.S. PATENT DOCUMENTS 4,461,966 7/1984 Gebenstreit .................. 307/270
4,520,438 5/1985 Norton ........................ 363/98
4,566,059 1/1986 Gallios et al. ................ 363/98
4,694,206 9/1987 Weinberg ..................... 307/270

Primary Examiner—Peter S. Wong
Attorney, Agent, or Firm—Armstrong, Nikaido, Marmelstein & Kubovcik

[57] ABSTRACT

An inverter apparatus includes at least one MIS transistor (Q1-Q4) connected in series between an input terminal (A, B) for inputting a direct-current voltage and an output terminal (C, D) connected to a load (5), and a circuit (1-4) generating a drive signal of a single frequency to cause the MIS transistor to effect a switching operation. By providing an inductance element (L1-L4) effecting a parallel resonance with an input capacitance of the transistor between a gate and a source of the MIS transistor, or by providing an inductance element (L) effecting a parallel resonance with an equivalent total capacitance of the circuit between the output terminal (C, D), it is possible to gain a stable output voltage of a desired high frequency and to raise a power conversion efficiency of the whole apparatus.

4 Claims, 5 Drawing Sheets

INVERTER APPARATUS

DESCRIPTION

TECHNICAL FIELD

The present invention relates to an inverter apparatus and, in particular, to an inverter apparatus in which a metal oxide semiconductor (MOS) transistor, broadly speaking, a metal insulator semiconductor (MIS) transistor, is connected in series between an input end of a direct-current voltage and a load, and the MOS transistor is driven by a drive signal of a single frequency, thereby converting the direct-current voltage into an alternating-current voltage corresponding to the single frequency. The apparatus according to the present invention can be utilized, for example, as a high frequency power source for a radio-frequency (RF) excitation-type carbonic acid gas ($CO_2$) laser equipment.

BACKGROUND ART

In the above-mentioned inverter apparatus, the frequency of an alternating-current output voltage corresponds to the frequency of a drive signal for driving a switching MOS transistor. Accordingly, to gain a stable output voltage having a defined frequency, the MOS transistor must quickly respond to the change in voltage of a drive signal of the defined frequency and carry out the switching operation thereof.

On the other hand, it is generally known that an equivalent input capacitance is exists between a gate and a source of a MOS transistor. Such an input capacitance is determined by the size of the source region, i.e., a diffusion region, and the concentration of impurities therein, a location of the gate and source, and the like, and is parasitically formed when the MOS transistor is formed on a semiconductor substrate.

Accordingly, where an input capacitance (capacitor) exists between the gate and the source of the transistor, a problem arises in that, due to the charging or discharging characteristics of the capacitor, the input voltage of the transistor cannot quickly follow the change in voltage of the aforementioned drive signal. Especially, the higher the frequency of the drive signal, the greater the influence. Accordingly, this problem must be solved, from the viewpoint of acquiring a stable high frequency output voltage. On the other hand, because of the power loss caused by resistors inserted in the input circuit, for compensating the influence of the capacitor, another problem arises in that the efficiency of the power conversion of the whole apparatus is lowered.

Furthermore, it is generally known that an equivalent output capacitance exists between a drain and a source of a MOS transistor. The output capacitance is parasitically formed during the forming of the transistor, as in the aforementioned input capacitance. The existence of the output capacitance (capacitor) causes not only the same problem as that in the aforementioned input capacitor, but also other problems.

The details of the problems arising due to the existence of the parasite input capacitor and parasite output capacitor of the aforementioned MOS transistor will be explained later.

DISCLOSURE OF THE INVENTION

A main object of the present invention is to provide an inverter apparatus capable of gaining a stable output voltage having a desired high frequency.

Another object of the present invention is to provide an inverter apparatus capable of not only decreasing a power loss therein, to increase the efficiency of the power conversion, but also raise the frequency thereof as a power source.

The above objects are attained by providing an inverter apparatus comprising: an input terminal for inputting a direct-current voltage; an output terminal connected to a load; a circuit for generating a drive signal of a single frequency; at least one MIS transistor connected in series between the input terminal and the output terminal, and carrying out a switching operation corresponding to the single frequency in response to the drive signal; and a first inductance element connected between a gate and a source of the MIS transistor and effecting a parallel resonance with an input capacitance of the transistor.

In the inverter apparatus according to the present invention, since an inductance element, which effects a parallel resonance with an input capacitance (capacitor) of a MIS transistor carrying out a switching operation, is provided between a gate and a source of the MIS transistor, an input voltage of the MIS transistor can quickly follow the change of the drive signal of the single frequency. That is, even if the level of the drive signal fluctuates, the MIS transistor quickly carries out the switching operation thereof without delay. Therefore, even if a frequency of a signal for driving the MIS transistor is made high, the apparatus of the present invention enables a stable high frequency voltage corresponding to the frequency to be gained.

Also, since resistors for compensating the influence by the input capacitance are not employed in the input circuit, a power loss due to the resistors can be reduced to zero, so that the efficiency of the inverter apparatus can be increased.

Furthermore, since the influence of the capacitor is eliminated, it is possible to solve the problem of the art, i.e., that a switching speed of the MIS transistor is marred with an increase in the frequency of the drive signal. This means that an upper limit of the frequency is not restricted, in other words, that the frequency of the apparatus of the present invention can be made as high as a power source.

BEST MODE FOR CARRYING OUT THE INVENTION

For a better understanding of the preferred embodiments of the present invention, the problems in the prior art apparatus will now be described in detail with reference to FIGS. 1 to 3.

Figure 1:
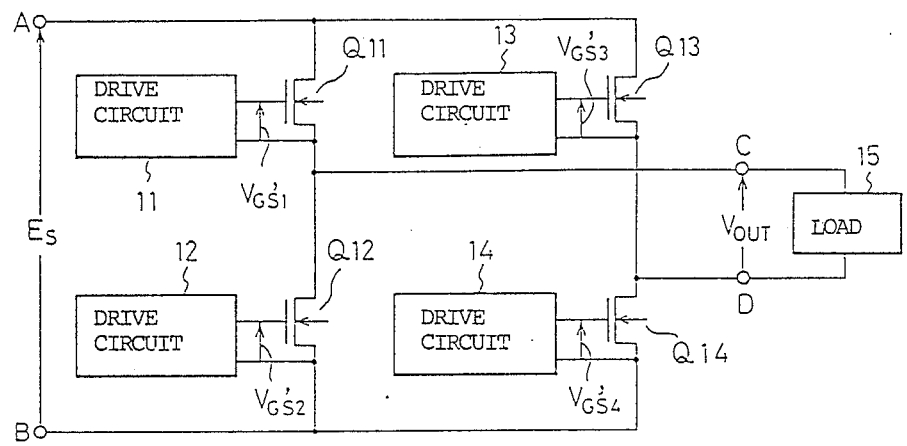
FIG. 1 is a circuit diagram illustrating a constitution of an inverter apparatus as an example in the art.

FIG. 1 illustrates a constitution of an inverter apparatus in the art. In FIG. 1, Q11, Q12, Q13 and Q14 denote N-channel type MOS transistors, and the transistors Q11 and Q12 are connected in series and the transistors Q13 and Q14 are connected in series between input terminals A and B for inputting a direct-current voltage $E_S$. A load 15 is connected between a connection point of the transistors Q11 and Q12 and a connection point of the transistors Q13 and Q14, and drive circuits 11, 12, 13 and 14 are connected between a gate and a source of each transistor Q11–Q14, respectively. Drive signals $V_{GS1}'$, $V_{GS2}'$, $V_{GS3}'$ and $V_{GS4}'$ of a single frequency are applied to the gate terminals of the transistors Q11–Q14, respectively. Note, the drive signals $V_{GS1}'$ and $V_{GS4}'$ are all the same and the drive signals $V_{GS2}'$ and $V_{GS3}'$ are also all the same. The former and the latter have an opposite phase relationship to each other. Accordingly, a pair of transistors Q11 and Q14 and another pair of transistors Q12 and Q13 alternately carry out an ON-/OFF operation in accordance with the frequency of the drive signal $V_{GS1}'$, and as a result, the positive voltage of $E_S$ is applied to the load 15 in the ON state of the transistors Q11 and Q14, and the negative voltage of $-E_S$ is applied to the load 15 in the ON state of the transistors Q12 and Q13.

Figure 2:
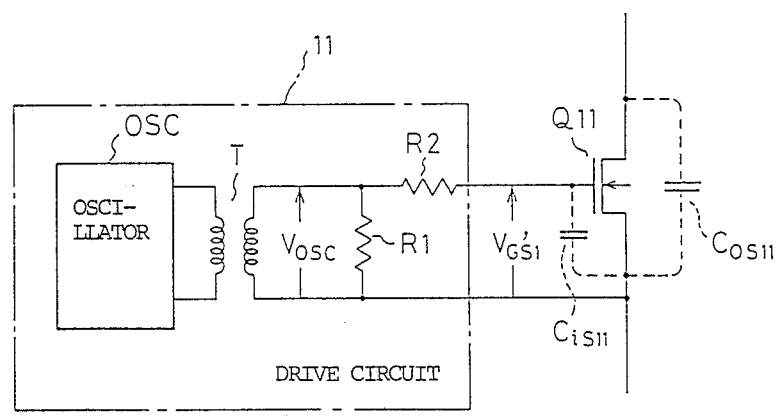
FIG. 2 is a diagram illustrating an example of a constitution of the drive circuit in FIG. 1.
Figure 3:
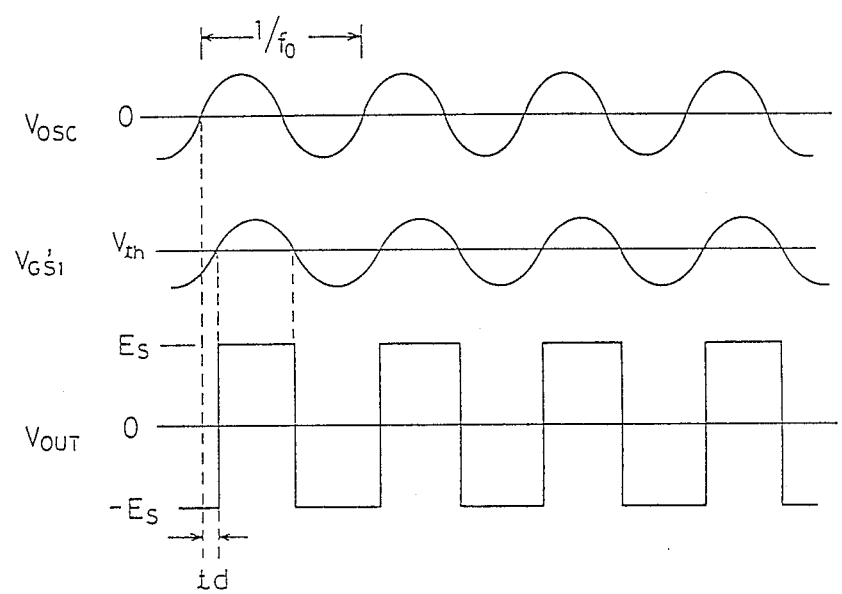
FIG. 3 is a waveform diagram showing the operation of the apparatus in FIG. 1.

FIG. 2 illustrates a constitution of the drive circuit shown in FIG. 1. A capacitor $C_{iS11}$ indicated by a broken line in FIG. 2 represents an input capacitance between the gate and source of the MOS transistor Q11, and a capacitor $C_{OS11}$ represents an output capacitance between the drain and source of the MOS transistor. The drive circuit 11 comprises an oscillator OSC for generating a signal of a single frequency, a transformer T for transmitting the oscillated signal to the secondary side thereof, while maintaining a state of electrical insulation, a resistor R1 connected in parallel with the transformer, and a resistor R2 connected in series with the circuit at the stage following the resistor R1. The transistor Q11 functions as a capacitive load, when seen from the drive circuit 11 in the direction of a load side. Accordingly, since there is a possibility of a parasitic oscillation occurring in the circuit, the above resistors R1 and R2 are employed to prevent that oscillation. In this case, the value of the resistor R2 is made high, from the viewpoint of a prevention of the oscillation. On the other hand, the value of the resistor R1 is made small compared with the impedance value of the capacitor $D_{iS11}$, so that the impedance of the transistor Q11, seen from the input side thereof, is considered to be a substantially pure resistance.

Thus, where the input capacitor $C_{iS11}$ exists between the gate and source of the switching MOS transistor Q11, a problem arises in that the input voltage $V_{GS1}'$ of the transistor cannot quickly follow the change in voltage of the oscillation signal $V_{OSC}$, due to the charging or discharging characteristics of the capacitor. FIG. 3 shows an operation waveform diagram for explaining this problem. As shown in FIG. 3, for example, in the charging operation of the capacitor, a delay time of $t_d$ is required in which the input voltage $V_{GS1}'$ of the MOS transistor reaches a predetermined level needed to turn ON the transistor, i.e., a threshold voltage $V_{th}$. The relationships therebetween are shown as follows.

Assuming that $V_{OSC} = V_m \sin 2\pi f_0 t$, $$V_{GS1}' = \frac{V_m}{1 + (2\pi f_0 \cdot C_{iS11} \cdot R2)^2} \cdot \sin 2\pi f_0(t - td')$$

$$td' = \frac{1}{2\pi f_0} \tan^{-1} 2\pi f_0 \cdot C_{iS11} \cdot R2$$

$$td = \frac{1}{2\pi f_0} \sin^{-1}\left(\frac{V_{th}}{V_{in}} \sqrt{1 + (2\pi f_0 \cdot C_{iS11} \cdot R2)^2}\right) + td'$$

Therefore, the phase angle of lag ($= 2\pi f_0 td$) of $V_{GS1}'$ is increased with an increase of $f_0$, and the timing of the switching of each transistor is greatly changed in accordance with the difference of the values of $C_{iS11}$ and $V_{th}$. Furthermore, as is easily understood from the above equations, where the frequency $f_0$ of the oscillation signal $V_{OSC}$ is raised to a predetermined value, a situation occurs in that the voltage $V_{GS1}'$ falls before the peak value thereof reaches the threshold voltage $V_{th}$, and as a result, a disadvantage may occur in that a desired high frequency output voltage cannot be obtained.

Also, in the drive circuit 11 shown in FIG. 2, another problem arises in that a drive efficiency is lowered because the output power of the oscillator is wasted in accordance with the power dissipated in the resistors R1 and R2.

On the other hand, with respect to the output capacitor $C_{OS11}$, the switching operation of the MOS transistor cannot be quickly carried out due to the existence of the parasitic capacitor. Accordingly, for example, when the transistor (Q11, Q12, Q13, Q14) is switched from the state (ON, OFF, OFF, ON) to (OFF, ON, ON, OFF), the charging current or discharging current of each capacitor $C_{OS11}$ of the transistors Q11 and Q12 flows through the transistor Q12 and, at the same time, the charging or discharging current flows through the transistor Q13 in the same manner. As a result, a problem arises in that a power loss is caused in accordance with the respective ON resistance of the transistors Q11–Q14 and the value of the respective output capacitor $C_{OS}$.

Also, as the frequency of the drive signal $V_{GS1}'$ is raised higher, a reactance of the capacitor $C_{OS}$ ($C_{iS}$ as well) is decreased and currents easily flow, resulting in a further power loss. Furthermore, since the deterioration in the speed of the above switching operation becomes more remarkable, another disadvantage may also occur in that a high speed operation, i.e., high frequency operation, cannot be conducted as the power source is damaged.

Next, the preferred embodiments of the present invention will be explained with reference to FIGS. 4 to 7.

Figure 4:
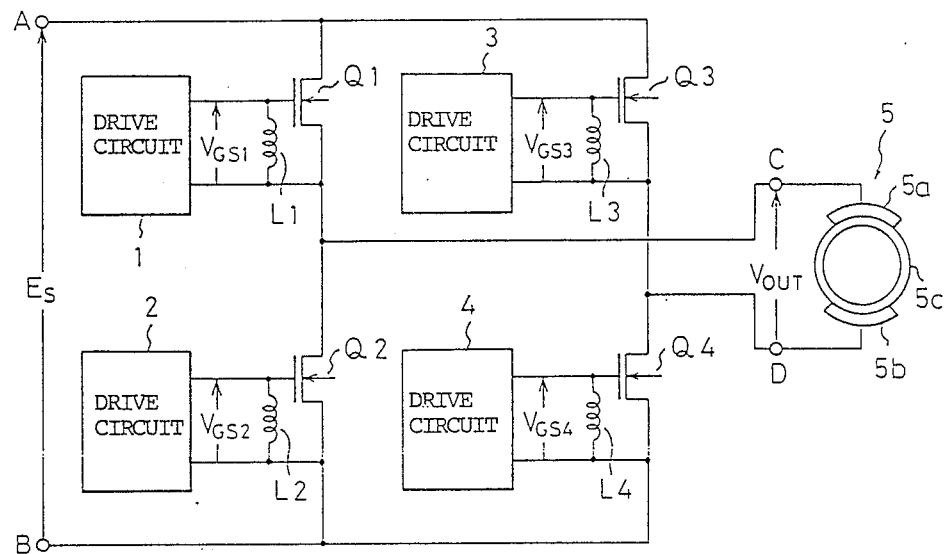
FIG. 4 is a circuit diagram illustrating a constitution of an inverter apparatus as an embodiment of the present invention.

FIG. 4 illustrates a circuit constitution of the inverter apparatus as an embodiment of the present invention. The illustration of FIG. 4 shows the case wherein the present apparatus is incorporated as a high frequency power source for an RF excitation type $CO_2$ laser equipment.

In FIG. 4, Q1–Q4 denote N-channel type MOS transistors, and the transistors Q1 and Q2 are connected in series and the transistors Q3 and Q4 are connected in series between input terminals A and B for inputting a direct-current voltage $E_S$. A laser tube 5 as a load is connected between a connection point of the transistors Q1 and Q2 and a connection point of the transistors Q3 and Q4, i.e., between output terminals C and D. The laser tube 5 includes a pair of electrodes 5a, 5b to which the alternating-current voltage is applied, and a quartz tube 5c for discharging. Also, coils L1, L2, L3 and L4 are connected between a gate and a source of each transistor Q1-Q4, respectively, and drive circuits 1, 2, 3 and 4 are connected in parallel with each coil, respectively. The drive circuits 1 and 4 have the same constitution and output an identical drive voltage, i.e., $V_{GS1}$ ($=V_{GS4}$), and the drive circuits 2 and 3 have the same constitution and output a drive voltage having a phase inverse to that of the above drive voltage $V_{GS1}$. Therefore, a pair of transistors Q1 and Q4 and another pair of transistors Q2 and Q3 alternately carry out an ON/OFF operation in accordance with the frequency of the drive voltage $V_{GS1}$, and as a result, the high frequency voltage having an amplitude of $E_S$, corresponding to the frequency of the drive voltage, is applied across the electrodes of the laser tube 5.

Figure 5:
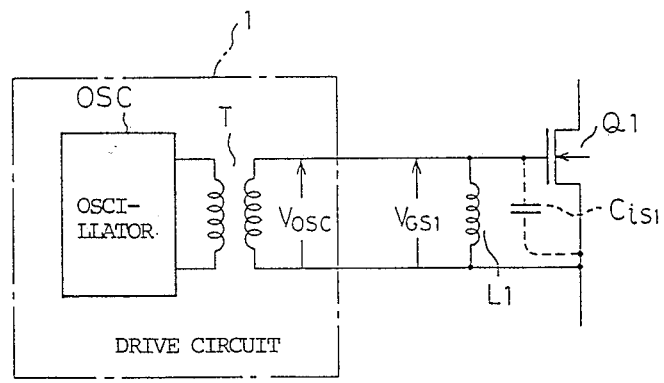
FIG. 5 is a diagram illustrating an example of a constitution of the drive circuit in FIG. 4.

FIG. 5 illustrates a constitution of the drive circuit shown in FIG. 4. A capacitor $C_{iS1}$ indicated by a broken line in FIG. 5 represents an input capacitance between the gate and source of the MOS transistor Q1. The drive circuit 1 comprises an oscillator OSC for generating a signal of a single frequency $f_0$, and a transformer T for transmitting the oscillated signal to the secondary side thereof, while maintaining the electrical insulation. Also, the coil L1 connected between the gate and source of the transistor Q1 is selected so that it will effect a parallel resonance with a gate input capacitance of the transistor, i.e., the capacitor $C_{iS1}$. That is, the following relationship exists between the value of each element and the frequency $f_0$ of the oscillation signal $V_{OSC}$:

$$f_0 = \frac{1}{2\pi \sqrt{L1 \cdot C_{iS1}}}$$

Thus, the coil L1 and the capacitor $C_{iS1}$ effect a parallel resonance with each other, so that an input impedance between the gate and source of the transistor Q1 seen from the drive circuit 1 becomes remarkably great. Also, a bad influence due to the charging or discharging characteristics of the capacitor $C_{iS1}$, i.e., a deterioration in frequency characteristics, can be cancelled by the function of coil L1. Accordingly, even if the frequency of the oscillation signal voltage $V_{OSC}$ is extremely high, the input voltage $V_{GS1}$ of the transistor Q1 can quickly follow the change in the oscillation signal voltage. In other words, when the level of the oscillation signal voltage $V_{OSC}$ is changed, the transistor Q1 quickly carries out the switching operation without delay.

Figure 6:
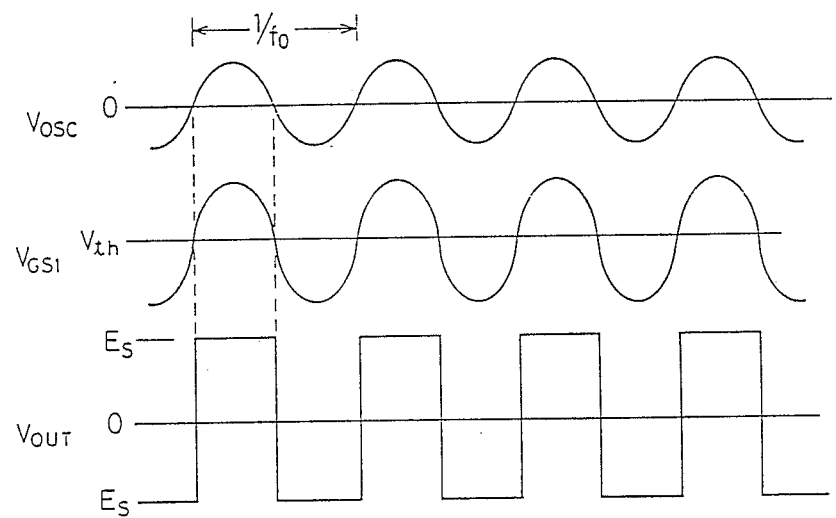
FIG. 6 is a waveform diagram showing the operation of the apparatus in FIG. 4.

FIG. 6 shows operation waveforms at each portion in the apparatus of FIG. 4. As shown in FIG. 6, the drive voltage, i.e., the voltage $V_{GS1}$ between the gate and source of the MOS transistor can quickly follow the change in level of the oscillation signal $V_{OSC}$ and change its level. Accordingly, as obvious from the comparison with FIG. 3 showing an example of the prior art, the output voltage $V_{OUT}$ of the inverter is generated without delay. Also, since the attenuation of amplitude accompanying the change in frequency does not appear in the voltage $V_{GS1}$ and the drive voltage $V_{GS1}$ reaches the level of the threshold voltage $V_{th}$ of the MOS transistor at a change in level of the oscillation signal $V_{OSC}$, the high frequency output voltage $V_{OUT}$ can be always obtained in accordance with the frequency $f_0$ of the oscillation signal even if the frequency $f_0$ becomes extremely high.

Therefore, the inverter apparatus according to the present embodiment is very advantageous for a load, the efficiency of which is increased with an increase in the frequency of the voltage applied, as in the laser tube 5 employed in the present embodiment.

Also, as shown in the constitution of the drive circuit of FIG. 5, power consuming elements heretofore been provided in the drive circuit for the reduction of a bad influence due to an input capacitance of an MOS transistor, e.g., the resistors R1 and R2 in FIG. 2, are omitted. Namely, it is possible to decrease the power dissipated by all of the drive circuits, and accordingly, the efficiency of the drive circuits can be increased.

Figure 7:
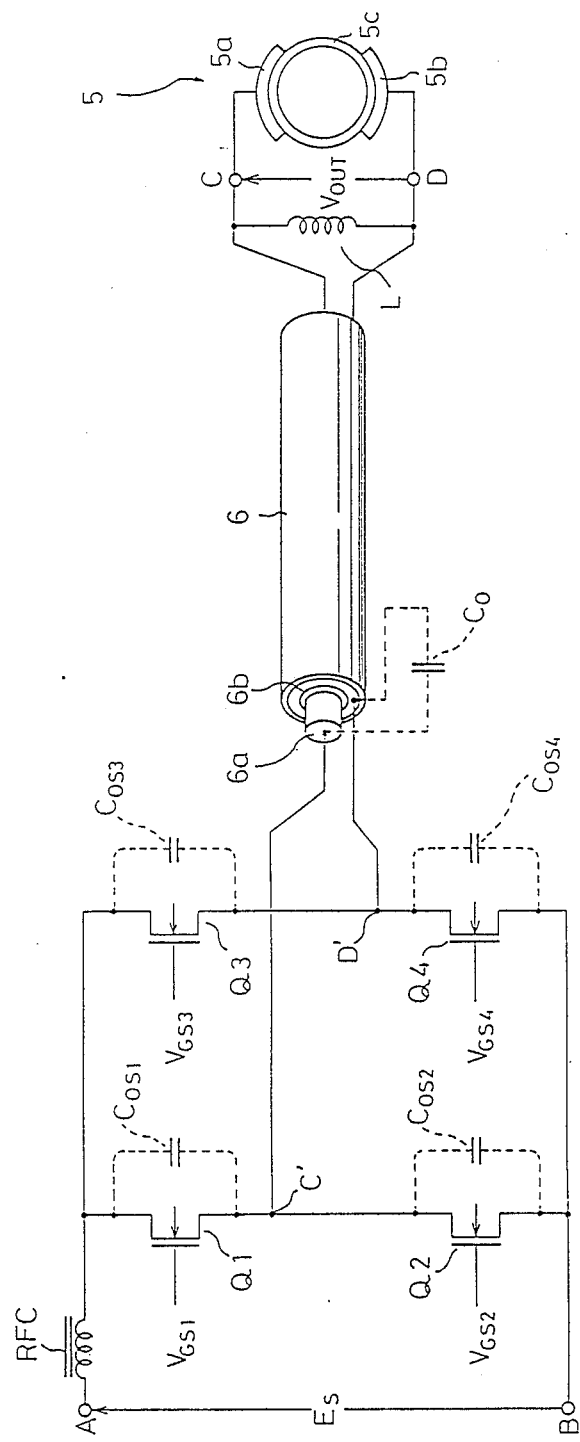
FIG. 7 is a circuit diagram illustrating a constitution of an inverter apparatus as another embodiment of the present invention.

FIG. 7 illustrates a circuit constitution of the inverter apparatus as another embodiment of the present invention. The illustration of FIG. 7 shows the case, as in the embodiment of FIG. 4, wherein the present apparatus is incorporated as a high frequency power source for an RF excitation type $CO_2$ laser equipment and, in particular, the constitution in which the distance between a load and a power supply part is relatively great.

In FIG. 7, RFC denotes a choke coil for maintaining a constant current flow through the circuit; Q1-Q4 denote MOS transistors as in the embodiment of FIG. 4; and capacitors $C_{0S1}$, $C_{0S2}$, $C_{0S3}$ and $C_{0S4}$ indicated by broken lines denote output capacitances between the drain and source of transistors Q1, Q2, Q3 and Q4, respectively. Also, a coil L is connected between a pair of electrodes 5a and 5b of the laser tube 5 as a load. Reference 6 denotes a co-axial cable for electrically connecting the inverter circuit and the laser tube, and having a central conductor 6a and a circumferential conductor 6b. Note, a capacitor $C_0$ indicated by a broken line represents an equivalent electrostatic capacitance of the cable 6. One electrode 5a of the laser tube 5 is connected via the central conductor 6a of the cable to the connection point between the transistors Q1 and Q2, and the other electrode 5b thereof is connected via the circumferential conductor 6b to the connection point between the transistors Q3 and Q4.

The aforementioned drive signals $V_{GS1}$, $V_{GS2}$, $V_{GS3}$ and $V_{GS4}$ of the single frequency $f_0$ are applied to the gates of the MOS transistors Q1-Q4, respectively.

The coil L connected in parallel with the laser tube 5 is selected to have an inductance effecting a parallel resonance with a total capacitance (total capacitor) seen from the electrode ends of the laser tube, i.e., the output terminals C and D, to the direction of an input side, i.e., the inverter circuit side. Namely, the following relationship exists between the value of each element and the frequency $f_0$ of the drive signal.

$$f_0 = \frac{1}{2\pi \sqrt{L(C_0 + C_k)}}$$

Note, a capacitor $C_k$ is represented by ($C_{0S2}+C_{0S3}$) or ($C_{0S1}+C_{0S4}$). The former corresponds to the case wherein the transistors (Q1, Q2, Q3, Q4) are switched from the state (OFF, ON, ON, OFF) to (ON, OFF, OFF, ON), and the latter corresponds to the case wherein the transistors are switched to the opposite state.

As stated above, since the coil L and the equivalent capacitor ($C_0+C_k$) effect a parallel resonance with each other, an input impedance seen from the electrode ends of the laser tube in the direction of the inverter circuit side becomes equivalent to a pure resistance. Namely, an influence by the capacitance of the whole apparatus including the output capacitances $C_{OS1}$–$C_{OS4}$ of the transistors is cancelled by the function of the coil L. Therefore, since there is the power loss, heretofore caused by the flow of the charging or discharging currents of the output capacitance through the transistor in the switching operation of the transistor is eliminated, the power conversion efficiency of the whole apparatus is increased. Particularly, the higher the frequency $f_0$ of the drive signal, the more remarkable the effect. This is why, when the coil L is not connected, each reactance of the output capacitors $C_{OS1}$–$C_{OS4}$ of the transistors is decreased with the increase in the frequency $f_0$ and, accordingly, the currents flow easily, resulting in a still further decrease in the power loss. This will be obvious from the following expression of the power loss P1:

$$P1 = f_0(C_{OS1} + C_{OS2} + C_{OS3} + C_{OS4})E_s^2$$

Also, since there is no influence due to the output capacitor $C_{OS1}$–$C_{OS4}$ of each transistor, in other words, the state in which elements dependent on the frequency do not equivalently exist is realized, it is not necessary to provide a condition for an upper limit of the frequency $f_0$ when each of the transistors is driven by the drive signal of the frequency $f_0$. Thus, it is possible to raise the frequency of the present apparatus as a power source, and to realize a quick switching of the MOS transistors Q1–Q4 regardless of the magnitude of the frequency $f_0$ The coil L may be provided at the input side of the cable 6, i.e., between the output ends C' and D' of the inverter.

Therefore, the inverter apparatus according to the present embodiment is very advantageous for a load of which an efficiency is increased with the increase in the frequency of the voltage applied, as in the laser tube 5.

Although in the disclosed and illustrated embodiments the CO₂ laser equipment is emphasized, the kind of laser is not restricted thereto. For example, the present invention is applicable to all other gas lasers such as an He-Ne, CO, excimer, and the like.

Also, the high frequency choke coil RFC employed in the embodiment of FIG. 7 may be adapted for the embodiment of FIG. 4.

I claim:

1. An inverter apparatus comprising:
    an input terminal (A, B) for inputting a direct-current voltage;
    an output terminal (C, D) connected to a load (5);
    a circuit (1, 2, 3, 4) for generating a drive signal of a single frequency;
    at least one MIS transistor (Q1, Q2, Q3, Q4) connected in series between said input terminal and said output terminal, and carrying out a switching operation corresponding to said single frequency in response to said drive signal; and
    a first inductance element (L1, L2, L3, L4) connected between a gate and a source of said MIS transistor and effecting a parallel resonance with an input capacitance of said transistor.

2. An inverter apparatus as set forth in claim 1, further comprising a second inductance element (L) connected in parallel with said output terminal (C, D) and effecting a parallel resonance with an equivalent total capacitance seen from said output terminal in the direction of an input side.

3. An inverter apparatus as set forth in claim 2, further comprising a third inductance element (RFC) connected in series with said MIS transistor (Q1, Q2, Q3, Q4) and providing a constant current input to said transistor at said single frequency.

4. An inverter apparatus as set forth in claim 3, further comprising a cable (6) for connecting an output end of said MIS transistor (Q1, Q2, Q3, Q4) with said output terminal (C, D), said second inductance element (L) having an inductance effecting a parallel resonance with a total capacitance of an equivalent electrostatic capacitance of said cable and an output capacitance of said MIS transistor.

* * * * *